United States Patent
Tomimori et al.

(10) Patent No.: US 7,192,835 B2
(45) Date of Patent: Mar. 20, 2007

(54) METHOD OF FORMING A HIGH-K FILM ON A SEMICONDUCTOR DEVICE

(75) Inventors: Hiroaki Tomimori, Kanagawa (JP); Hidemitsu Aoki, Kanagawa (JP); Toshiyuki Iwamoto, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 7 days.

(21) Appl. No.: 10/854,306

(22) Filed: May 27, 2004

(65) Prior Publication Data

US 2004/0248350 A1 Dec. 9, 2004

(30) Foreign Application Priority Data

Jun. 6, 2003 (JP) ............................. 2003-163017

(51) Int. Cl.
H01L 21/302 (2006.01)
H01L 21/336 (2006.01)

(52) U.S. Cl. ...................... 438/287; 438/745; 438/754; 438/755

(58) Field of Classification Search ................ 438/287, 438/745, 754–755
See application file for complete search history.

(56) References Cited

U.S. PATENT DOCUMENTS

| | | | |
|---|---|---|---|
| 6,465,853 B1 | 10/2002 | Hobbs et al. | |
| 6,818,553 B1* | 11/2004 | Yu et al. | 438/648 |
| 2003/0235985 A1* | 12/2003 | Christenson et al. | 438/689 |
| 2004/0188385 A1* | 9/2004 | Yamada et al. | 216/83 |
| 2004/0262262 A1* | 12/2004 | Chiu et al. | 216/67 |
| 2005/0029230 A1* | 2/2005 | Fujii | 216/83 |
| 2006/0009039 A1 | 1/2006 | Fujii | |

FOREIGN PATENT DOCUMENTS

| | | | |
|---|---|---|---|
| JP | 2003-8004 | | 1/2003 |
| JP | 2003332297 | * | 11/2003 |
| JP | WO2004/025718 | * | 3/2004 |

* cited by examiner

*Primary Examiner*—Thanh Nguyen
(74) *Attorney, Agent, or Firm*—Young & Thompson

(57) ABSTRACT

According to the present invention, high-k film can be etched to provide a desired geometry without damaging the silicon underlying material. A silicon oxide film 52 is formed on a silicon substrate 50 by thermal oxidation, and a high dielectric constant insulating film 54 comprising HfSiOx is formed thereon. Thereafter, polycrystalline silicon layer 56 and high dielectric constant insulating film 54 are selectively removed in stages by a dry etching through a mask of the resist layer 58, and subsequently, the residual portion of the high dielectric constant insulating film 54 and the silicon oxide film 52 are selectively removed by wet etching through a mask of polycrystalline silicon layer 56. A liquid mixture of phosphoric acid and sulfuric acid is employed for the etchant solution. The temperature of the etchant solution is preferably equal to or lower than 200 degree C., and more preferably equal to or less than 180 degree C.

6 Claims, 8 Drawing Sheets

FIG. 5

| | etch rate for sample 1 (Å/min.) | etch rate for sample 2 (Å/min.) | selection ratio | irregularity of Si Substrate (Å) |
|---|---|---|---|---|
| DHF (0.5 %, room temp.) | 9.5 | 40 | 0.24 | |
| phosphoric acid (160 degree C) | >40 | 20 | ca. 2 | 4-5 |
| phosphoric acid and sulfuric acid (160 degree C) | >30 | 3 | >10 | 0.3-0.5 |

(processing: for 1 min)

FIG. 6

|  | etch rate for sample 1 (Å/min.) | etch rate for sample 2 (Å/min.) | selection ratio |
|---|---|---|---|
| phosphoric acid (80 degree C) | 10 | <0.25 | >40 |
| phosphoric acid (120 degree C) | 40 | 1.6 | 25 |
| phosphoric acid (160 degree C) | >40 | 20 | ca. 2 |

FIG. 7

|  | etch rate for sample 1 (Å/min.) | etch rate for sample 2 (Å/min.) | selection ratio | irregularity of Si Substrate (Å) |
|---|---|---|---|---|
| BDG + HF (10 %) | >70 | 250 | 0.3 | 0 |
| BDG + HF (5 %) | >70 | 28 | <2.6 | 0 |
| BDG + HF (2.5 %) | 30 | 5 | 8 | 0 |
| BDG + HF (1 %) | 20 | <1 | >20 | 0 |
| BDG + HF (0.5 %) | 20 | <1 | >20 | 0 |
| DHF (10 %) | >120 | 900 | <0.1 | 0 |
| DHF (5 %) | >120 | 390 | <0.3 | 0 |
| DHF (2.5 %) | 100 | 180 | 0.6 | 0 |
| DHF (1 %) | 40 | 70 | 0.6 | 0 |
| DHF (0.5 %) | 9.5 | 40 | 0.24 | 0 |

FIG. 8

|  | etch rate for sample 1 (Å/min.) | etch rate for sample 2 (Å/min.) | selection ratio | irregularity of Si Substrate (Å) |
|---|---|---|---|---|
| BDG + HF (10 %) | <1 | 250 | <0.01 | 0 |
| BDG + HF (5 %) | <1 | 28 | <0.1 | 0 |
| BDG + HF (1 %) | <1 | <1 | <1 | 0 |
| DHF (10 %) | <1 | 900 | <0.01 | 0 |
| DHF (5 %) | <1 | 390 | <0.01 | 0 |
| DHF (1 %) | <1 | 70 | <0.1 | 0 |

METHOD OF FORMING A HIGH-K FILM ON A SEMICONDUCTOR DEVICE

This application is based on Japanese patent application NO. 2003-163017, the content of which is incorporated hereinto by reference.

FIELD OF THE INVENTION

The present invention relates to a semiconductor device comprising a metal compound film on a semiconductor substrate and manufacturing method thereof.

BACKGROUND OF THE INVENTION

In recent years, utilizations of a higher dielectric constant thin film called high-k film for the application of a material composing of a semiconductor device are investigated. Typical high-k materials include oxides containing Zr, Hf or the like. Novel superior device performances can be achieved by employing such materials for a gate insulating film of MOSFET and a capacity film of a capacitance element.

JP-A-2003-8004 (paragraphs [0026] to [0029] and FIG. 1) describes a MOSFET having a gate insulating film of a multi-layered structure ($Al_2O_3$—$HfO_2$—$Al_2O_3$) comprising aluminum oxide films formed on both of an upper and a bottom surfaces of a hafnium oxide film. When the high-k material is employed for a gate insulating film of a transistor, thinner film thickness converted into the silicon oxide film may be applicable even if the thickness of the gate insulating film is designed to be thicker in a certain level, thereby providing the gate insulating film which is physically and structurally stable.

In the preparations for forming the transistor comprising such gate insulating film, it is necessary to remove gate insulating films formed in regions where gate electrode is not formed after the gate electrode is fabricated. If this gate insulating film is not removed to remain thereon, the undesired short-channel effect may be remarkable, thereby reducing the reliability of the transistor.

Nevertheless, the hafnium oxide film is generally difficult to be etched. In the above-described patent application, it is described that the gate insulating film can be etched off by conducting reactive ion etching (RIE), and it is also described therein that if it is not sufficient with RIE, plasma etching may be employed. However, in reality, it is not easy to remove hafnium oxide film by conducting the dry etching. In particular, it is necessary to conduct a thermal processing at relatively higher temperature in the step for annealing the gate electrode or the like during the manufacturing process for the MOSFET. During this step, crystallization of the hafnium oxide film is caused to further convert the hafnium oxide film into a film that is more difficult to be etched.

In addition, when the hafnium oxide film is dry etched, there might be a problem of plasma damage to an underlying material of the high-k material. In addition, silicon substrate is undesirably etched by the dry etching of the hafnium oxide film to vary the junction depth of the impurity diffusion layer of the transistor, thereby increasing the leakage current therefrom.

On the other hand, even if the hafnium oxide film is to be removed via the wet etching, the removal thereof may not easily be carried out. Such circumstances are described in No. 50 Extended Abstracts, Japan Society of Applied Physics and Related Societies (Oyo Butsurigaku Kankei Rengo Koenkai Koen Yokoshu), No. 2 (issued Mar. 27, 2003, at Kanagawa University), p.p. 934 (29a-ZW-5), entitled "Wet etching of $HfO_2$ by irradiating ultra-violet ray (Shigaisen-o shosha suru $HfO_2$ no wet etching)", and it is described in the literature that the hafnium oxide film is difficult to be etched off and it is also described that the etching thereof becomes possible if the wet etching of such film with phosphoric acid under the exposure to the UV light is conducted. Conversely, there is nothing more difficult film for being etched off than the hafnium oxide film so that such special processing must be conducted.

In addition, it is critical that the surface of the silicon substrate as an underlying material should not be damaged when the etching is conducted in the case of carrying out the wet etching. As described earlier, it is general to form a silicon thermal oxide film between the film consisting of high-k material and the substrate, and an etchant available for etching the hafnium oxide film may also ordinarily etch the silicon thermal oxide film, so that these films are simultaneously removed with the identical etchant, and eventually the surface of the silicon substrate is exposed. When such process is adopted, silicon substrate is readily damaged. Such problem is similarly occurred when silicon native oxide film is chemically formed during a process step for cleaning the substrate employing a sulfuric acid-hydrogen peroxide mixture (SPM) and/or an ammonia-hydrogen peroxide mixture (APM), in addition to the case of forming the silicon thermal oxide film.

Further, in the case of wet etching, a device isolating film of shallow trench isolation (STI) structure is exposed to the surface by the etching, and thus problems of causing dissolution and/or damage of the exposed device isolating film may be caused when the above-described etchant is used. This is because the device isolation film is ordinarily constituted of a silicon oxide film, which is readily dissolved by using the etchant available for etching the hafnium oxide film.

SUMMARY OF THE INVENTION

In view of the above situation, the present invention provides a solution to the above described problems, and it is an object of the present invention to provide a technology for etching a high-k film to provide a desired geometry thereof without damaging an underlying silicon substrate material.

According to one aspect of the present invention, there is provided a method for manufacturing a semiconductor device, comprising: forming a metal silicate film on an underlying material containing silicon, the metal silicate film containing, as main chemical elements, silicon, oxygen and one, two or more of metallic element or elements selected from the group consisting of Hf, La, Zr and Al: and removing the metal silicate film to expose the underlying material, wherein the metal silicate film is removed during the removal of the metal silicate film by employing a chemical liquid solution containing an oxidizing acid or a salt thereof.

According to another aspect of the present invention, there is provided a method for manufacturing a semiconductor device, comprising: forming a gate insulating film comprising a metal silicate film on an underlying material containing silicon, the metal silicate film containing, as main chemical elements, silicon, oxygen and one, two or more of metallic element or elements selected from the group consisting of Hf, La, Zr and Al: forming a gate electrode film on the gate insulating film; selectively removing the gate electrode film to process thereof to a geometry of a gate electrode and to expose the metal silicate film; and removing the metal silicate film to expose a surface of the underlying material, wherein the metal silicate film is removed during said removal of said metal silicate film by employing a chemical liquid solution containing an oxidizing acid or a salt thereof.

As described earlier in the section of the prior art, the high-k film containing refractory metal such as hafnium or the like is generally difficult to be etched. On the contrary, the present invention employs a configuration, in which the metal silicate film is formed in place of such metal film and the formed film is etched off by using an oxidizing acid or a salt thereof, so that the etching processing for the configuration, which has been difficult in the conventional technology, is facilitated to be carried out, thereby enabling a stable formation of the semiconductor device comprising the high-k film. The metal silicate film may be formed by various methods, and it is preferable to employ a method of introducing silicon by using a silicon containing gas during the formation of the film. This configuration provides introducing sufficient quantity of silicon into the films, such that the removing with the above-described chemical liquid solution becomes possible. The removing process with the chemical liquid solution may be conducted in a manner of, for example, dissolving of the metal silicate film to remove thereof. Molar ratio (Si/(Si+Hf)) of silicon and hafnium in the metal silicate film may preferably be equal to or higher than 5%, and more preferably equal to or higher than 10%. This configuration provides better etch performances with higher stability.

In addition, according to the present invention, the oxidizing acid or the salt thereof is employed as described above for removing the metal silicate film to expose the underlying material containing silicon, and therefore the level of the damage to the underlying material can be reduced to the minimum level. Here, "underlying material containing silicon" indicates a silicon substrate itself or a silicon substrate having a film formed thereon and having an uppermost surface comprising a silicon-containing film. The silicon-containing film may include silicon oxide film, silicon nitride film, silicon oxynitride film or the like.

The method for manufacturing the semiconductor device according to the present invention may have a configuration, in which a device isolation film including a silicon oxide film having shallow trench isolation (STI) structure is formed on the underlying material and the device isolating film is exposed when the metal silicate film is removed to expose the underlying material.

Since the device isolation film is ordinarily composed of silicon oxide film, problems of the dissolving and/or the damage may be occurred by using the above-described etchant. On the contrary, the present invention employs the oxidizing acid or the salt thereof, such that the damage to such a device isolation film can be reduced to the minimum level.

According to further aspect of the present invention, there is provided a method for manufacturing a semiconductor device, comprising: forming a metal silicate film on an underlying material containing silicon, the metal silicate film containing, as main chemical elements, silicon, oxygen and one, two or more of metallic element or elements selected from the group consisting of Hf, La, Zr and Al: and removing the metal silicate film to expose the underlying material, wherein the metal silicate film is removed during the removal of the metal silicate film by employing a chemical liquid solution containing an organic solvent and hydrofluoric acid or a salt thereof.

According to yet other aspect of the present invention, there is provided a method for manufacturing a semiconductor device, comprising: forming a gate insulating film comprising a metal silicate film on an underlying material containing silicon, the metal silicate film containing, as main chemical elements, silicon, oxygen and one, two or more of metallic element or elements selected from the group consisting of Hf, La, Zr and Al: forming a gate electrode film on the gate insulating film; selectively removing the gate electrode film to process thereof to a geometry of a gate electrode and to expose said metal silicate film; and removing the metal silicate film to expose a surface of the underlying material, wherein the metal silicate film is removed during the removal of the metal silicate film by employing a chemical liquid solution containing an organic solvent and hydrofluoric acid or a salt thereof.

According to these aspects of the present invention, the metal silicate film is removed by using the chemical liquid solution comprising a combination of the organic solvent and hydrofluoric acid. Thus, the handleability of the chemical liquid solution is improved. In addition, the high-k film can be etched to provide a desired geometry without damaging to the silicon underlying material.

BRIEF DESCRIPTION OF THE DRAWINGS

FIG. 5 is a table, describing the result of the evaluation obtained from an example 1.

FIG. 6 is a table, describing the result of the evaluation obtained from an example 1.

FIG. 7 is a table, describing the result of the evaluation obtained from an example 2.

FIG. 8 is a table, describing the result of the evaluation obtained from a comparative example.

DETAILED DESCRIPTION OF THE PREFERRED EMBODIMENTS

A chemical liquid solution available to be employed in the present invention contains an oxidizing acid or a salt thereof. The chemical liquid solution may contain pure water. Having such configuration, the damage of underlying material comprising silicon caused by the chemical liquid solution can be more effectively inhibited.

The oxidizing acid or the salt thereof available to be employed in the present invention may preferably contain one, two or more selected from the group consisting of phosphoric acid, sulfuric acid, nitric acid, perchloric acid, periodic acid, permanganic acid and salts thereof and ceric ammonium nitrate. Having such configuration, the metal silicate film can preferably be removed. In addition, the damage to the silicon underlying material can be reduced to a minimum level.

When phosphoric acid is selected as the above-described acid, the etching of the metal silicate film can be more stably conducted. Further, a liquid mixture of phosphoric acid and sulfuric acid may be employed to effectively inhibit the roughening of the surface of the underlying silicon. This aspect will be described later in the description of the examples.

The temperature of the chemical liquid solution may preferably be equal to or lower than 200 degree C., and more preferably equal to or lower than 180 degree C. during the removal of the metal silicate film. The lower limit of the temperature thereof may be, for example, 40 degree C., and more preferably equal to or higher than 60 degree C. Having such configuration, the metal silicate film can stably be removed while inhibiting the roughening of the surface of the underlying silicon.

In the present invention, various types of films may be employed for the metal silicate film. More specifically, the metal silicate film containing, as main chemical elements, silicon, oxygen and one, two or more of metallic element or elements selected from the group consisting of Hf, La, Zr and Al may be employed, and among these, the film containing hafnium particularly provide more remarkable effect obtainable by the present invention. By etching such film with the chemical liquid solution according to the present invention, the etching can stably be carried out with higher efficiency. Here, the above-described metal silicate film may additionally contain nitrogen.

Methods for manufacturing a semiconductor device according to the present invention will be described as follows with reference to FIGS. 1A to 1D and FIGS. 2A to 2D. The description thereof will be made by illustrating a method for manufacturing a transistor as follows.

Figure 1A:
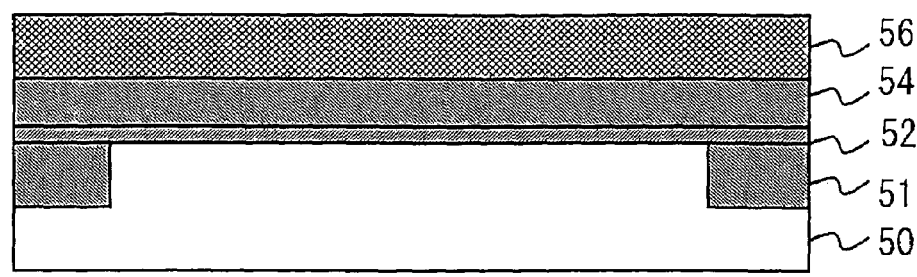
FIGS. 1A to 1D are schematic cross sectional views of a semiconductor device, showing manufacturing steps for the semiconductor device according to an embodiment of the present invention.

First, as shown in FIG. 1A, a device isolation film 51 of the shallow trench structure is formed on a silicon substrate 50, and then a silicon oxide film 52 (for example, film thickness 0.8 nm) is formed by a thermal oxidation, and a high dielectric constant insulating film 54 comprising HfSiOx (for example, film thickness 2.0 nm) is formed thereon, and further, a polycrystalline silicon layer 56 (for example, film thickness 200 nm) is formed thereon via chemical vapor deposition (CVD). The device isolation film 51 has a structure, in which a CVD silicon oxide film is embedded in a trench formed on the silicon substrate 50.

Metal organic chemical vapor deposition (MOCVD) is employed as a method for forming the high dielectric constant insulating film 54 here.

Figure 1B:
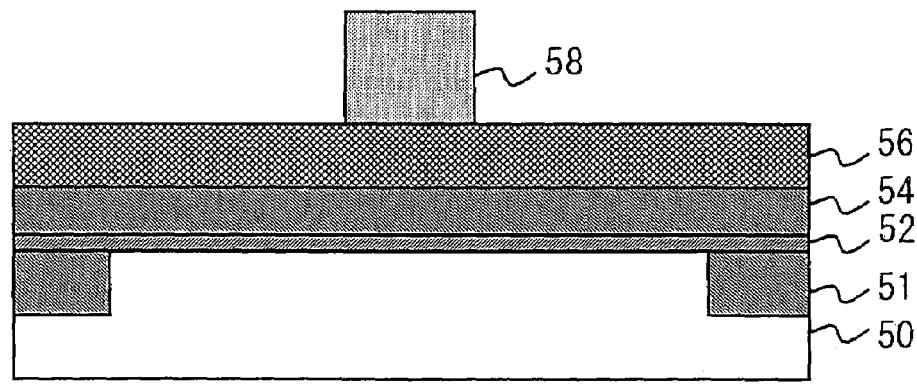
Figure 1C:
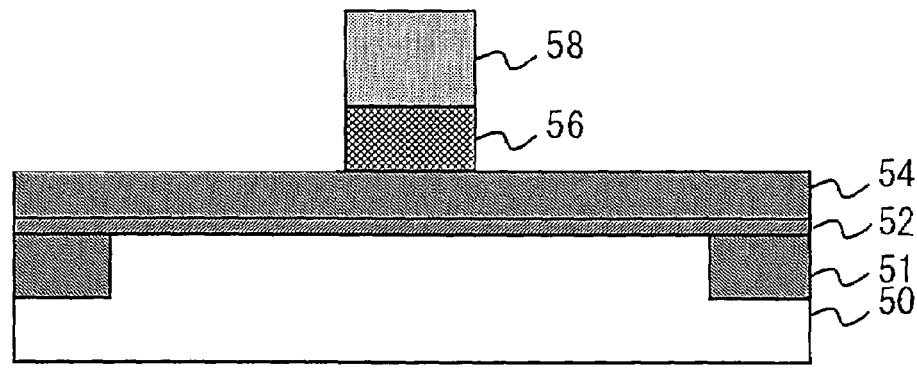
Figure 1D:
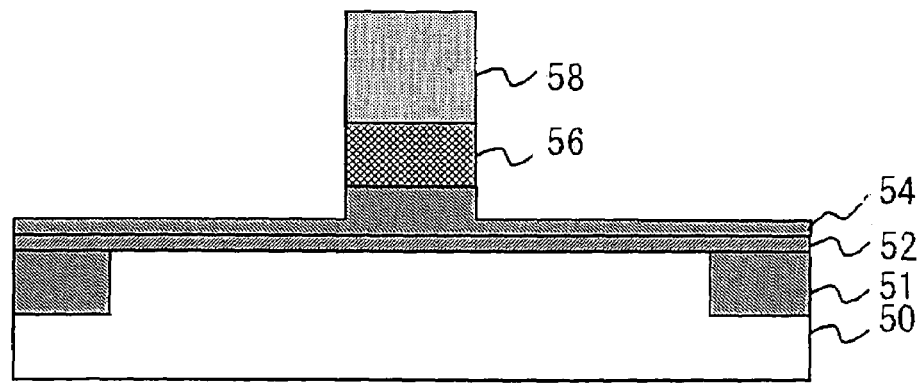
Figure 2A:
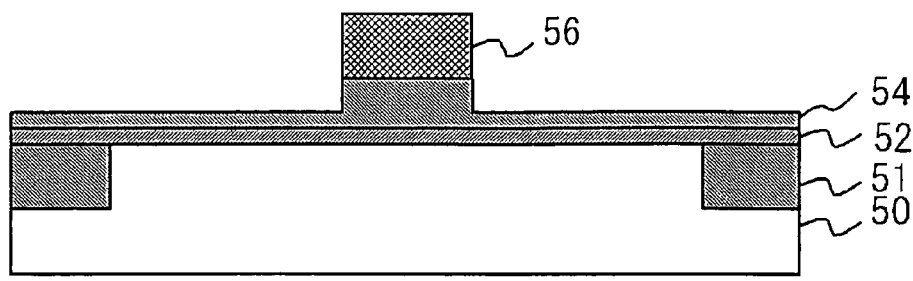
FIGS. 2A to 2D are schematic cross sectional views of a semiconductor device, showing manufacturing steps for the semiconductor device according to an embodiment of the present invention.

Subsequently, as shown in FIG. 1B, a resist film is formed on the polycrystalline silicon layer 56, and a resist layer 58 is formed by employing a lithography technology utilizing an excimer laser. Thereafter, as shown in FIG. 1C and FIG. 1D, polycrystalline silicon layer 56 and high dielectric constant insulating film 54 are selectively removed in stages by a dry etching through a mask of the resist layer 58. After conducting the etching to the halfway in the thickness of high dielectric constant insulating film 54, the resist layer 58 and the residual matter are removed by a sulfuric acid-hydrogen peroxide mixture (SPM) and/or an ammonia-hydrogen peroxide mixture (APM) (FIG. 2A).

Figure 2B:
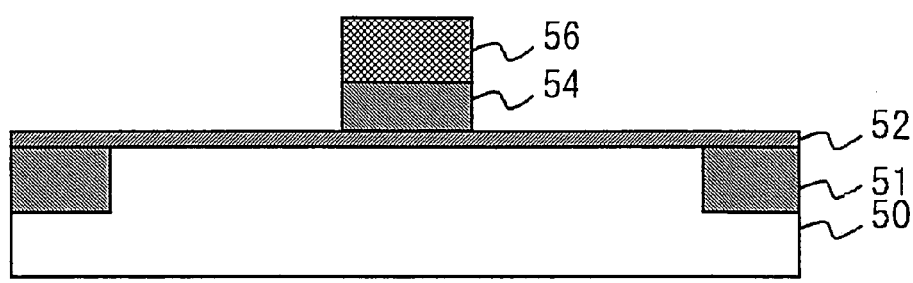
Figure 2C:
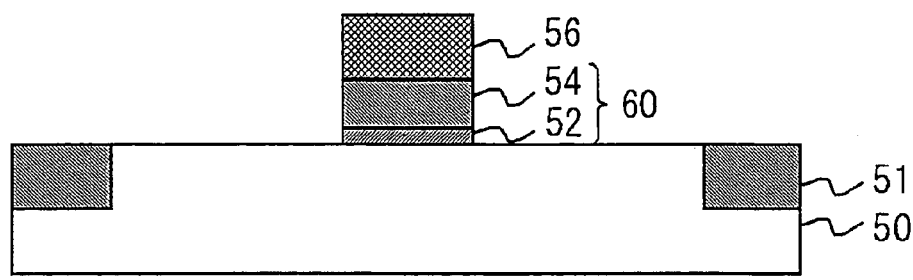

Subsequently, the residual portion of the high dielectric constant insulating film 54 and the silicon oxide film 52 are selectively removed by a wet etching through a mask of polycrystalline silicon layer 56 (FIG. 2B and FIG. 2C). The surface of silicon substrate 50 is exposed by conducting this procedure. A liquid mixture of phosphoric acid and sulfuric acid is employed for the etchant solution. The temperature of the etchant solution is preferably equal to or lower than 200 degree C., and more preferably equal to or less than 180 degree C. The lower limit of the temperature is 40 degree C., for example, and more preferably equal to or higher than 60 degree C.

Thereafter, the surface of the silicon substrate 50 is rinsed. In this embodiment, after completing a first rinse step employing pure water or warm water, a second rinse step employing isopropyl alcohol is carried out. This removes moisture having remained on the surface of the silicon substrate 50, thereby preventing the formation of the watermarks on the surface of the silicon substrate 50.

Figure 2D:
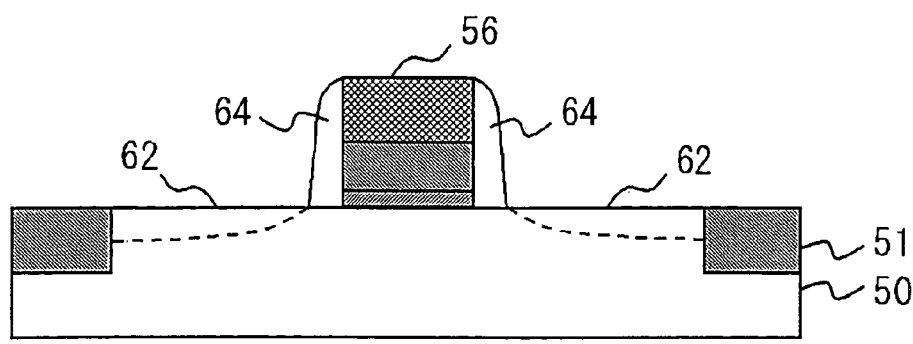

Subsequently, after conducting an ion implantation process for forming an extension region by a known technology, side walls 64 are formed, and thereafter, ions are implanted onto the surface of the silicon substrate 50. This provides the formation of impurity regions 62 on both sides of the gate electrode containing polycrystalline silicon layer 56 (FIG. 2D). Subsequently, a metal layer is formed on the entire surface of the silicon substrate 50 (not shown), and a silicidation of a portion of the metal layer contacting with the polycrystalline silicon layer 56 and the impurity region 62, and thereafter the other portion of the metal layer is removed to form a metal silicide layer in a gate electrode, a source and a drain region (not shown.) Here, polycrystalline SiGe layer can be employed for the gate electrode, in place of the polycrystalline silicon layer 56.

Figure 3:
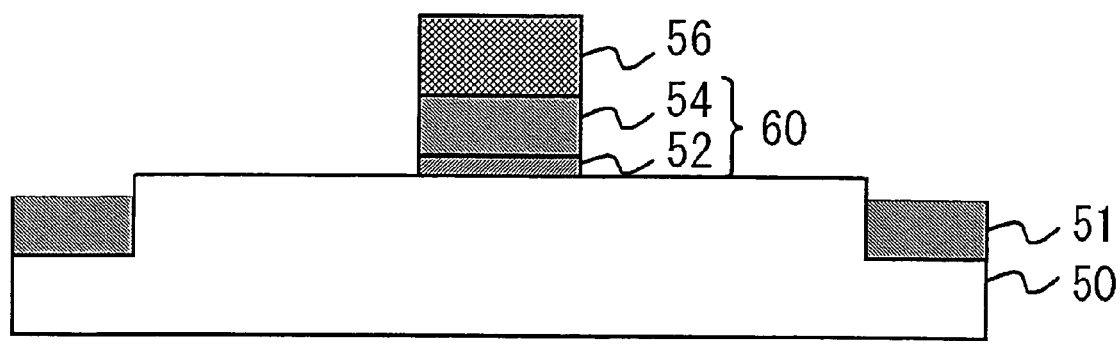
FIG. 3 is a schematic cross sectional view of a semiconductor device, showing a manufacturing step for a conventional semiconductor device.

According to the present embodiment, silicon is introduced into the hafnium oxide film to form the silicate film, and phosphoric acid is employed as an etchant solution, and further the temperature of the etchant solution is preferably selected, so that the hafnium type gate insulating film can easily be etched off, thereby reducing the damage to the surface of the substrate to a minimum level. In the process using hydrofluoric acid or the like that has been conventionally used as an etchant solution, the surface of the silicon substrate 50 is damaged during the step of FIG. 2C. In addition, as shown in FIG. 3, the device isolation film 51 is dissolved by the etching, and there may be a harmful result of causing an increase of leakage current or the like. In this embodiment, such problems can be solved. In addition, according to this embodiment, the damage of the surface of the polycrystalline silicon layer 56 composing the gate electrode can effectively be inhibited, and the reliability of the device can be improved from this point of view.

In addition, if moisture remains on the surface of the silicon substrate 50 when ion implantation onto the surface of the silicon substrate 50 is conducted, watermark is formed to cause non-uniform condition for the ion implantation. According to the method of this embodiment, such a problem can be solved.

Although the silicon substrate 50 is exposed by the wet etching shown in FIG. 2B and FIG. 2C in this embodiment, the etching may be stopped at the stage shown in FIG. 2B to leave the silicon oxide film 52 in the regions thereof other than the region just under of gate electrode.

In addition, although the present embodiment employs a configuration, in which the dry etching is conducted to the halfway in the thickness of the high dielectric constant insulating film 54 as shown in FIG. 1D and thereafter the remaining portion of the high dielectric constant insulating film 54 and the silicon oxide film 52 are selectively removed by the wet etching (FIG. 2B and FIG. 2C), etching of the high dielectric constant insulating film 54 may be conducted by only a wet etching without employing a dry etching.

The present invention has been described on the basis of the preferred embodiment. It should be understood by a person having ordinary skills in the art that the present embodiment is disclosed for an illustration only, and the various changes thereof are available and are within the scope of the present invention.

For example, although the high dielectric constant insulating film 54 is deposited via MOCVD in the above-described embodiment, other method for depositing films may be employed. For example, the solid phase diffusion may be employed. By illustrating the deposition of hafnium silicate, a hafnium film is first deposited on, or in contact with, the surface of the silicon oxide film via physical vapor deposition (PVD.) After the deposition, an oxygen annealing may be conducted to form hafnium silicate (HfSiOx.) Alternatively, a silicate film containing nitrogen can be formed via a method employing a silicon oxynitride film as the underlying layer, or a method of introducing nitrogen into an annealing atmosphere, or the like. In addition, the material for the high dielectric constant insulating film 54 is not limited to hafnium-containing silicate, and a metal silicate film containing a metal selected from the group consisting of La, Zr and Al may be employed for the high dielectric constant insulating film 54.

Alternatively, after the deposition of the high dielectric constant insulating film 54, a silicon nitride film may be formed thereon, or a nitridation processing may be conducted for the upper portion of the high dielectric constant insulating film 54. Having such modified configuration, the leakage current through the gate insulating film can effectively be reduced. The nitridation processing can be conducted by, for example, a plasma processing using a nitrogen-containing compound such as $N_2O$, $NH_3$ or the like, after having formed the high dielectric constant insulating film 54. In the nitridation processing, remote plasma may preferably be utilized. The processing apparatus utilizing remote plasma may comprise a separated plasma generation chamber separated from the processing chamber containing a substrate therein, comprising a gas inlet, a waveguide and a microwave applying means, and the plasma generated in the plasma generation chamber is guided through a silica tube to the chamber containing the substrate therein. The plasma processing for the substrate surface is conducted in the processing chamber. By adopting such a system, sufficient level of the nitridation can be achieved while inhibiting the damage to the substrate. Here, the wet etching employing a chemical liquid solution containing an oxidizing acid or the like according to the present invention or a salt thereof is effective, even in the case described above where the nitridation layer is disposed on the surface thereof.

Figure 4A:
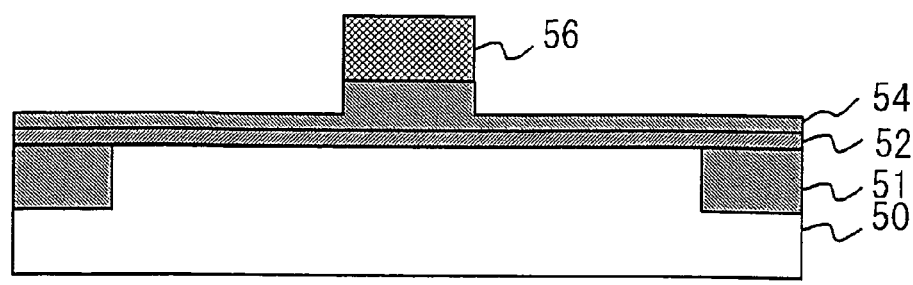
FIGS. 4A to 4C are schematic cross sectional views of a semiconductor device, showing manufacturing steps for the semiconductor device according to another embodiment of the present invention.
Figure 4B:
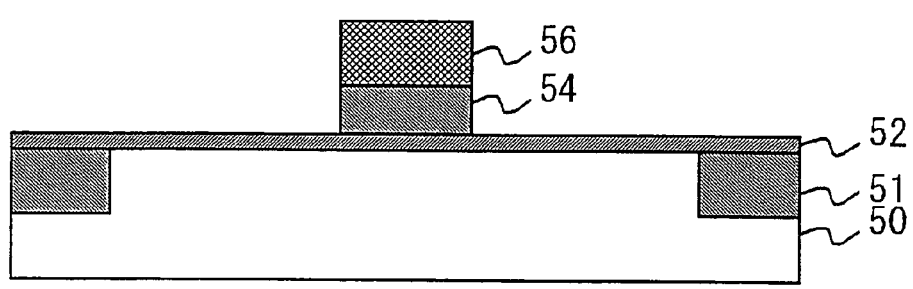
Figure 4C:
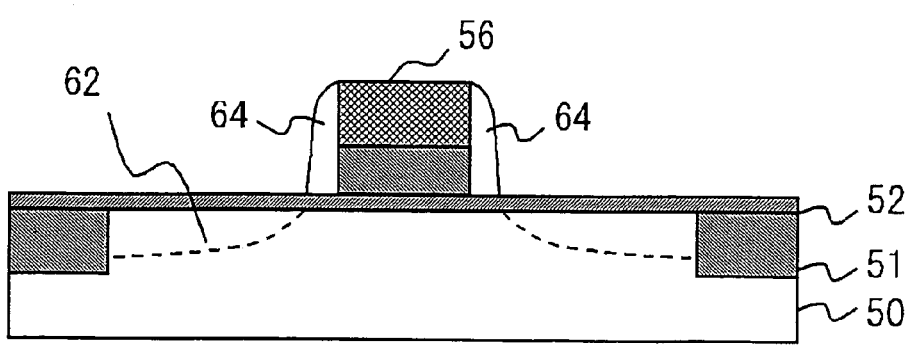

Although the silicon oxide film 52 is completely removed in the step of FIG. 2C in the above-described embodiment, the film may totally or partially be remained. FIGS. 4A to 4C show the steps thereof. As shown in FIG. 4A and FIG. 4B, the high dielectric constant insulating film 54 may be etched off, and thereafter an ion implantation may be conducted under the condition where the silicon oxide film 52 is remained on the surface of the silicon substrate 50 to manufacture a transistor shown in FIG. 4C.

Although the high dielectric constant insulating film 54 is removed by using the phosphoric acid type chemical liquid solution in the above-described embodiment, other types of chemical liquid solutions may be employed. For example, a chemical liquid solution containing hydrofluoric acid or a salt thereof with an organic solvent can be employed. Having such configuration, the handleability of the chemical liquid solution is improved, and in addition, the high-k film can be etched to provide a desired geometry without damaging to the silicon underlying material. In this case, the preferable organic solvent may have a higher flash point in view of better handleability, and for example, di- or tri-alkylene glycol monoalkyl ether type solvents may be employed. More specifically, the preferable organic solvents include diethylene glycol monobutyl ether, diethylene glycol monomethyl ether, dipropylene glycol monomethyl ether, dipropylene glycol monoethyl ether, triethylene glycol monomethyl ether, tripropylene glycol monomethyl ether, tripropylene glycol monoethyl ether or the like. In addition, N-methylpyrrolidone (NMP), propylene carbonate, dimethylsulfoxide (DMSO), butyrolactone, dimethylacetamide, dihydrofurfuryl alcohol (THFA) or the like are available, in place of di- or tri-alkylene glycol monoalkyl ether type solvent, and one of these or a mixture of not less than two of these may be employed. Although the second rinse step utilizing isopropyl alcohol is conducted after carrying out the first rinse step utilizing pure water or warm water in the present embodiment, the rinse method is not limited thereto and various types of rinse methods can be adopted. For example, only a rinse step utilizing pure water or warm water may be employed. Alternatively, the rinse step may be carried out by utilizing a mixture of pure water with ammonia dissolved therein or a mixture of pure water with ammonia and hydrogen, both of which is dissolved therein. In this case, the rinse step may comprise only the rinse step utilizing these rinse liquids, or may further comprise an additional rinse step utilizing isopropyl alcohol thereafter.

In addition, although the formation of the transistor is described for illustrating the present invention in the above-described embodiment, the present invention may be applicable to the formation of a capacitance element. In particular, when doped polysilicon is employed for the lower electrode and a capacitance having a multi-layered structure comprising a capacitance film of a high-k material and an upper electrode is formed thereon, etching of the capacitance film is difficult and moreover, the damage to the underlying polysilicon caused in the etching process becomes a problem. The method according to the present invention provides a manufacturing of the capacitance having such a structure with higher production yield and higher process stability.

EXAMPLES

Example 1

HfSiOx was formed on a surface of a single crystalline silicon substrate by MOCVD. The thickness of the obtained HfSiOx was 4 to 5 nm. This sample is called as "sample 1." Mole ratio (Si/(Si+Hf)) of silicon and hafnium in the above-described silicate film was equal to or higher than 5%.

As a comparative example, a single crystalline silicon substrate was thermally processed to form a thermal oxide film on the surface of the substrate. The thickness of the obtained $SiO_2$ was 100 nm. This sample is called as "sample 2."

Etching processes were carried out for the sample 1 and the sample 2 by using the following chemical liquid solutions.

(i) 0.5% diluted hydrofluoric acid: at a room temperature;
(ii) Phosphoric acid: at 160 degree C.; and
(iii) Liquid mixture of phosphoric acid and sulfuric acid: at 160 degree C.

Here, phosphoric acid and sulfuric acid employed in the examples were commercially available products that are generally employed for the semiconductor applications.

The duration time for the etching was set to one minute. The results of the etch rates for each of the samples and ratios among these etch rates are shown in FIG. 5. It is clarified that the etching utilizing the chemical liquid solution containing phosphoric acid provides considerably improved etch ratio, which is defined as (etch rate of $HfSiO_x$)/(etch rate of $SiO_2$), as compared with the case of utilizing diluted hydrofluoric acid (DHF.)

Further, surface roughness of the silicon substrate after the etching was also observed by using an atomic force microscope. The results are also shown in FIG. 5. It is clarified that the addition of sulfuric acid into phosphoric acid in the chemical liquid solution provides the improved surface roughness. It is also known from the results of other experiments that the addition of sulfuric acid in phosphoric acid in the chemical liquid solution also provides the improved surface roughness of the polycrystalline silicon that composes the gate electrode. Here, the measurements of the surface roughness in the experiments utilizing DHF were not conducted, because enough selection ratios were not obtained.

Next, the etching processes were conducted by using phosphoric acid for the above described sample 1 and sample 2 at various solution temperatures, and the etch rates corresponding to various solution temperatures were measured. The results are shown in FIG. 6. As long as the measured ranges are concerned, it is clarified that lower temperature provides further improved etch ratio, which is defined as (etch rate of $HfSiO_x$)/(etch rate of $SiO_2$). Here, it was confirmed that the etch rate for phosphoric acid at the room temperature was considerably deteriorated in the measurements for samples 1 and 2.

Example 2

A sample 1 and a sample 2 were prepared similarly as in the example 1, and etching processes were conducted with the following chemical liquid solutions. The etching temperature was set to the room temperature. Molar ratios of silicon and hafnium (Si/(Si+Hf)) in the above-described silicate films were not lower than 5%.

(i) Mixture solution containing hydrofluoric acid, butyl diglycol (diethylene glycol monobutyl ether; hereinafter abbreviated as BDG), and pure water, mixture ratio of hydrofluoric acid to pure water was 1:1; and (ii) Diluted hydrofluoric acid.

The duration time for the etching was set to one minute. The results of the etch rates for each of the samples and ratios among these etch rates are shown in FIG. 7. In FIG. 7, "HF (10%)" means that 50% HF aqueous solution (i.e., mixing ratio of hydrofluoric acid to pure water was 1:1) was employed to obtain a solution having a HF concentration of 10% over the entire etchant solution. "DHF (10%)" also means 10% HF aqueous solution. It is clarified that the etching utilizing butyl diglycol solution containing hydrofluoric acid provides considerably improved etch ratio, which is defined as (etch rate of $HfSiO_x$)/(etch rate of $SiO_2$), as compared with diluted hydrofluoric acid (DHF.) In addition, it is also clarified that when the system utilizing butyl diglycol solution containing hydrofluoric acid is employed, the surface roughness of the silicon substrate after the etching is reduced.

Although the reason of obtaining better etching characteristics by employing the etchant solution utilizing BDG in this example is not necessarily clear, the reason may be presumed as follows. Components of HF and $HF2^-$ exist in the HF aqueous solution and the etch rate for the film depends on the ratio of these components. When an organic solvent such as BDG or the like is added to the HF aqueous solution, the concentration of $HF2^-$, which contributes to the etching of the silicon thermal oxide film, is reduced. Thus, it is presumed that the etch rate for the silicon thermal oxide film ($SiO_2$) deteriorates, and the etch ratio, which is defined as (etch rate of HfSiOx)/(etch rate of SiO2), is improved.

Comparative Example

The same etchant solution as used in Example 2 was employed to conduct an evaluation for a hafnium oxide film as an etching object. In this comparative example, HfOx was formed via MOCVD on a surface of a single crystalline silicon substrate to a film thickness of 4 to 5 nm. Etching processes over this type of films were conducted with the following chemical liquid solutions. The etching temperature was set to the room temperature.

(i) Mixture solution containing hydrofluoric acid, butyl diglycol (diethylene glycol monobutyl ether; hereinafter abbreviated as BDG), and pure water, mixture ratio of hydrofluoric acid to pure water was 1:1; and (ii) Diluted hydrofluoric acid The duration time for the etching was set to one minute. The results of the etch rates for each of the samples and ratios among these etch rates are shown in FIG. 8. In FIG. 8, "HF (10%)" means that 50% HF aqueous solution (i.e., mixing ratio of hydrofluoric acid to pure water was 1:1) was employed to obtain a solution having a HF concentration of 10% over the entire etchant solution. "DHF (10%)" also means 10% HF aqueous solution. It is clarified that the hafnium oxide film can not sufficiently be etched by using the above-described etchant solution (i).

It is clarified from the results of Example 2 and Comparative Example that the etching ability considerably differs depending upon the type of the film to be etched when the etchant solution containing hydrofluoric acid, butyl diglycol and pure water is employed, and that the above described etchant solution specifically provides better etching ability specific to hafnium silicate.

According to the present invention, the high-k film can be etched to provide a desired geometry without damaging an underlying silicon substrate material, and the semiconductor device including the high-k film as a structural component can stably be formed.

What is claimed is:

1. A method for manufacturing a semiconductor device, comprising the steps of:

forming a metal silicate film on an underlying material containing silicon, said metal silicate film containing, as main chemical elements, silicon, oxygen and one, two or more of metallic element or elements selected from the group consisting of Hf, La, Zr and Al: and removing said metal silicate film to expose said underlying material, wherein said metal silicate film is removed during said removal of said metal silicate film by employing a chemical liquid solution containing one or more solvent or solvents selected from the group consisting of an ether-type organic solvent, N-methylpyrrolidone (NMP), propylene carbonate, butyrolactone, dimethylsulfoxide (DMSO), dimethylacetamide and dihydrofurfuryl alcohol (THFA), and hydrofluoric acid or a salt thereof.

2. The method of claim 1, wherein said underlying material containing silicon is $SiO_2$.

3. The method of claim 1, wherein said ether-type organic solvent is butyl diglycol (BDG).

4. The method of claim 3, wherein a concentration of the hydrofluoric acid is between 0.5% and 5%.

5. A method for manufacturing a semiconductor device, comprising the steps of:
   forming a gate insulating film comprising a metal silicate film on an underlying material containing silicon, said metal silicate film containing, as main chemical elements, silicon, oxygen and one, two or more of metallic element or elements selected from the group consisting of Hf, La, Zr and Al;
   forming a gate electrode film on said gate insulating film;
   selectively removing said gate electrode film to process thereof to a geometry of a gate electrode and to expose said metal silicate film; and
   removing said metal silicate film to expose a surface of said underlying material,
   wherein said metal silicate film is removed during said removal of said metal silicate film by employing a chemical liquid solution containing one or more solvent or solvents selected from the group consisting of an ether-type organic solvent, N-methylpyrrolidone (NMP), propylene carbonate, butyrolactone, dimethylsulfoxide (DMSO), dimethylacetamide and dihydrofurfuryl alcohol (THFA), and hydrofluoric acid or a salt thereof.

6. The method of claim 5, wherein said underlying material containing silicon is $SiO_2$.

* * * * *